United States Patent
Koch

[11] Patent Number: 5,973,513
[45] Date of Patent: Oct. 26, 1999

[54] INTEGRATED CIRCUIT ARRANGEMENT WITH AN OPEN-COLLECTOR TRANSISTOR DESIGNED AS NPN TRANSISTOR

[75] Inventor: Anton Koch, Rosenstr. 10, D-74834 Elztal-Auerbach, Germany

[73] Assignee: Anton Koch, Heilbronn, Germany

[21] Appl. No.: 08/852,473

[22] Filed: May 7, 1997

[30] Foreign Application Priority Data

May 22, 1996 [DE] Germany .......................... 196 20 564

[51] Int. Cl.[6] .................. H03K 19/0175; H03K 19/082; H03K 19/003
[52] U.S. Cl. ................ 326/89; 326/15; 326/90; 327/382
[58] Field of Search ................. 326/89, 15, 90; 327/382, 478, 489, 387

[56] References Cited

U.S. PATENT DOCUMENTS

| | | | |
|---|---|---|---|
| 4,564,769 | 1/1986 | Melamed | 327/478 |
| 4,721,869 | 1/1988 | Okado | 326/89 |
| 4,965,466 | 10/1990 | Pigott | 327/535 |

FOREIGN PATENT DOCUMENTS

| | | |
|---|---|---|
| 57121321 | 7/1982 | European Pat. Off. . |
| 03270407 | 12/1991 | Japan . |
| 2204445 | 11/1988 | United Kingdom . |

OTHER PUBLICATIONS

J. Millman et al.: "Microelectronics". McGraw–Hill, New York, 1988, p. 180.

"Kurzschlussfester 'Open–Collector'—Ausgang mit niedriger Sättigungsspannung" by R. Glitsch. Elektronik Bd. 34, Nr. 22, 1985.

U. Tietze et al.: "Halbleiter–Schaltungtechnik" [Semiconductor Circuit Technology]. Springer–Verlag, Berlin, 1978, p. 161.

*Primary Examiner*—Michael Tokar
*Assistant Examiner*—Daniel D. Chang
*Attorney, Agent, or Firm*—Venable; George H. Spencer; Norman N. Kunitz

[57] ABSTRACT

In an integrated circuit arrangement with an open-collector transistor of the npn type, the collector of the open-collector transistor is connected through a collector resistor with preferably low ohmic resistance to an open-collector output of the circuit arrangement to which an output voltage is applied, and, through a parasitic diode which is switched in the reverse direction when the output voltage has a positive value, to a ground terminal of the circuit arrangement. The emitter of the open-collector transistor is connected to the ground terminal of the circuit arrangement and the base of the open-collector transistor is connected to a base current source that generates a base current. The open-collector transistor is switched to an inverse conducting state by the base current when the voltage value of the output voltage is below a negative threshold voltage value, in which state a voltage drop occurs across the collector resistor that is so great that the parasitic diode remains switched in the reverse direction.

8 Claims, 1 Drawing Sheet

INTEGRATED CIRCUIT ARRANGEMENT WITH AN OPEN-COLLECTOR TRANSISTOR DESIGNED AS NPN TRANSISTOR

BACKGROUND OF THE INVENTION

The invention relates to an integrated circuit arrangement with an open-collector transistor of the npn-transistor type, the collector of which is connected to an open-collector output of the circuit arrangement and the emitter of which is connected to a ground terminal of the circuit arrangement, and with an output voltage being provided as the open-collector output.

A circuit arrangement of this kind is known from the reference literature Tietze/Schenk: "Halbleiter-Schaltungstechnik" (Semiconductor Circuit Technology), Springer-Verlag, Berlin, 1978, page 161. The circuit arrangement described there has a npn transistor as an output stage with the emitter of this transistor is connected to a ground terminal and with the collector of the transistor connected to an open-collector output of the circuit arrangement and with an output voltage being applied to this output. The open-collector output can be connected to open-collector outputs of other circuit arrangements and, through a resistor, to a supply terminal to which a supply voltage is fed.

From the reference literature Millman/Grabel: "Microelectronics", McGraw-Hill, New York, 1988, page 180, it is known furthermore that the collector region of a npn transistor in an integrated circuit can be isolated from other circuit components in the circuit arrangement by a p-doped separation zone. The main disadvantage of this circuit arrangement is that the collector region of the open-collector transistor and the separation zone form a parasitic diode which can become conductive and thus allow parasitic currents to flow. Such parasitic effects can lead to the destruction or incorrect functioning of the circuit arrangement.

SUMMARY OF THE INVENTION

The object of the invention is therefore to provide a circuit arrangement of the type originally described that can be made by simple means and which has improved properties with respect to parasitic effects.

The object is solved by the circuit arrangement according to the present invention: Advantageous developments and further developments are described in the Subclaims.

In accordance with the invention, the collector of the open-collector transistor is connected through a collector resistor, preferably with a low ohmic resistance, to the open-collector output of the circuit arrangement, at which the output voltage is available, and through a parasitic diode to the ground terminal of the circuit arrangement to which a reference potential is applied. The parasitic diode is formed from the collector region of the open-collector transistor and from a p-doped separation zone surrounding this collector region and provided to isolate the open-collector transistor from other circuit components in the circuit arrangement. It is switched in the reverse direction when the output voltage has a positive value, i.e. it is connected on the cathode side to the collector of the open-collector transistor and on the anode side to the ground terminal of the circuit arrangement. The open-collector transistor can be driven by a base current generated by a base current source connected to the base of the open-collector transistor. It is operated in the forward direction when the output voltage is positive and in the reverse direction when the output voltage is negative and if the output voltage is below a negative threshold voltage level it is switched by the base current into an inversely conductive state in which across the collector resistor there is a voltage drop which, because of the collector current of the open-collector transistor flowing through the collector resistor, is so large that the parasitic diode remains switched in the reverse direction.

The base current source has preferably a control current source which is connected with the base of the open-collector transistor and through which a switching signal applied to a switching input of the control current source can be switched. With positive voltage values at the open-collector output, the open-collector transistor can be switched on and off by switching the control current source, i.e. it can be switched between a low ohmic state and a higher ohmic state.

In an advantageous design of the circuit arrangement, the base current source has a first control transistor and a first quiescent current source which is connected to the collector of the first control transistor. The first control transistor and the open-collector transistor are arranged in the circuit and are provided as a reflection current arrangement with the first quiescent current source as reference current source. For low ohmic coupling of the base current, the base current source has a second control transistor, the base of which is connected to the collector of the first control transistor and the emitter of which is connected to the base of the first control transistor and the collector of which is connected to a supply terminal of the circuit arrangement to which a supply voltage is applied. For driving the second control transistor, it preferably has a third control transistor connected to the second control transistor as Darlington stage.

It is particularly advantageous to use a comparator stage to generate a limiting signal through which the base current can be reduced if the current values of the collector current exceed a threshold current value. The collector current can thus be limited to current values that are below the threshold value. The comparator stage preferably has two comparator inputs connected separately each to one of the terminals of the collector resistor as well as a comparator output to which the limitation signal is applied. This limitation signal is fed to a control input of the base current source connected to the comparator output of the comparator stage, through which input the base current can be controlled.

The circuit arrangement presented combines several advantages:

- it has a small number of circuit elements and can therefore be integrated at low cost in an integrated circuit;
- it has a high dielectric strength for negative voltage values of the output voltage: the voltage values of the output voltage at the open-collector output may be lower than the reference potential applied to the ground terminal by more than one diode forward voltage and the permissible value range of the output voltage can be preset by the collector resistor and the collector current;
- it has a high short-circuit strength owing to the limitation of the collector current; and
- the voltage values of the output voltage are low when the open-collector transistor is switched on and operated in the forward direction.

BRIEF DESCRIPTION OF THE DRAWING

The FIGURE is a schematic circuit diagram of a circuit arrangement according to the invention.

DESCRIPTION OF THE PREFERRED EMBODIMENTS

Figure 1:
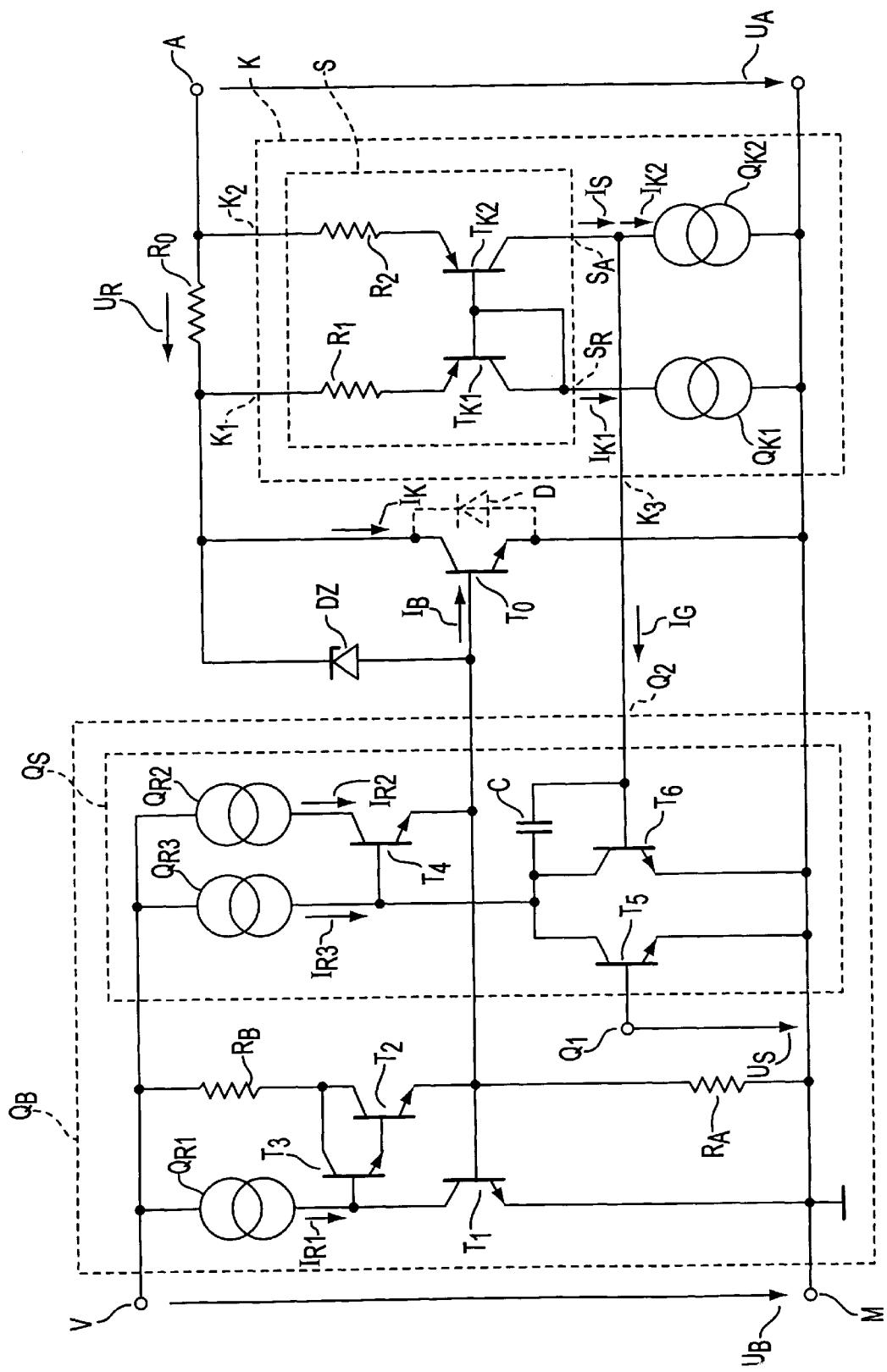

The circuit arrangement in accordance with the invention will now be described in more detail with reference to an embodiment example shown in the FIGURE.

As shown in the Figures, the collector of the open-collector transistor $T_o$ is connected through the collector resistor $R_o$, across which there is a voltage drop $U_R$, to the open-collector output A of the circuit arrangement, at which the output voltage $U_A$ appears. Moreover, the emitter of the open-collector transistor $T_o$ is connected to the ground terminal M of the circuit arrangement, at which a reference potential is applied, and the base of the open-collector transistor $T_o$ is connected to the base current source $Q_B$ which supplies the base current $I_B$ to control the open-collector transistor $T_o$. The zener diode DZ, the cathode side of which is connected to the collector and the anode side with the base of the open-collector transistor $T_o$, is provided to protect the open-collector transistor $T_o$ against excessive collector-emitter voltages. The entire circuit arrangement is integrated on a semiconductor substrate of an integrated circuit, where other circuit components not shown in the figure can also be integrated on the same semiconductor substrate. The collector of the open-collector transistor $T_o$ is surrounded by a p-doped separation zone connected to the ground terminal M and isolated by this zone from other n-doped semiconductor regions. The separation zone and the collector region of the open-collector transistor $T_o$ form the parasitic diode D indicated by the broken lines.

The base current source $Q_B$ comprises the control current source $Q_S$, the first quiescent current source $Q_{R1}$, the first control transistor $T_1$, the second control transistor $T_2$, the third control transistor $T_3$, the limiting resistor $R_B$ and the leakage resistor $R_A$. The emitter of the first control transistor $T_1$ is connected to the ground terminal M, the collector of the first control transistor $T_1$ is connected to the base of the third control transistor $T_3$ and through the first quiescent current source $Q_{R1}$ to the supply terminal V, to which the supply voltage $U_B$ is. Moreover, the collectors of the second and third control transistors $T_2$ and $T_3$ are connected through the limiting resistor $R_B$ to the supply terminal V and the base of the first control transistor $T_1$ is connected to the emitter of the second control transistor $T_2$, with the base of the open-collector transistor $T_o$ and through the leakage resistor $R_A$ to the ground terminal M. The leakage resistor $R_A$ is provided to set a defined potential at the base of the first control transistor $T_1$ and the limiting resistor $R_B$ is provided to limit the flow of current through the second control transistor $T_2$.

The control current source $Q_S$ comprises the second quiescent current source $Q_{R2}$, the third quiescent current source $Q_{R3}$, the fourth control transistor $T_4$, the fifth control transistor $T_5$, the sixth control transistor $T_6$, and the capacitor C. The emitter of the fourth control transistor $T_4$ is connected to the base of the open-collector transistor $T_o$, the collector of the fourth control transistor $T_4$ is connected through the second quiescent current source $Q_{R2}$ to the supply terminal V, and the base of the fourth control transistor $T_4$ is connected to collectors of the fifth and sixth control transistors $T_5$ and $T_6$, through the capacitor C to the control input $Q_2$ of the base current source $Q_B$, and also through the third quiescent current source $Q_{R3}$ to the supply terminal V. The base of the fifth control transistor $T_5$ is connected to the circuit terminal $Q_1$ of the control current source $Q_S$, to which a voltage is applied as switching signal Us for switching the control current source $Q_S$, and the base of the sixth control transistor $T_6$ is connected to the control input $Q_2$ of the base current source $Q_B$ which at the same time represents a control input of the control current source $Q_S$ and to which a current is applied as limiting signal $I_G$.

The comparator stage K comprises the two comparator resistors $R_1$, $R_2$, the two comparator transistors $T_{K1}$, $T_{K2}$ and the two constant current sources $Q_{K1}$, $Q_{K2}$. The emitter of the first comparator transistor $T_{K1}$ is connected through the first comparator resistor $R_1$ to the first comparator input $K_1$ of the comparator stage K and with first terminal of the collector resistor $R_0$ that is connected to the collector of the open-collector transistor $T_o$. The emitter of the other comparator transistor $T_{K2}$ is connected through the other comparator resistor $R_2$ to another terminal of the collector resistor $R_0$ that is connected to the open-collector output A, the bases of the comparator transistors $TK_1$, $TK_2$ are connected to the collector of the first comparator transistor $TK_1$ and through the first constant current source $QK_1$ to the ground terminal M, and the collector of the other comparator transistor $TK_2$ is connected to the comparator output $K_3$ that is connected to the control input $Q_2$ of the base current source $Q_B$, and through the other constant current source $Q_{K2}$ to the ground terminal M. The two comparator resistors $R_1$, $R_2$ and the two comparator transistors $T_{K1}$, $T_{K2}$ thus form a reflection or mirror current arrangement S with the collector of the first one comparator transistor $T_{K1}$ as reference current input $S_R$, to which the current $I_{K1}$ of the first constant current source $Q_{K1}$ is applied as a reference current, and with the collector of the other comparator transistor $T_{K2}$ as reflection current output $S_A$ to which the reflection current $I_S$ is applied.

The control transistors $T_1$, $T_2$, $T_3$, $T_4$, $T_5$, $T_6$, and the open-collector transistor $T_o$ are designed as npn transistors and the comparator transistors $T_{K1}$, $T_{K2}$ as pnp transistors. The open-collector transistor $T_o$ is thus driven in the forward direction when the output voltage $U_A$ has positive voltage values, i.e., when there are positive potentials at the open-collector output A with respect to the reference potential at ground terminal M. It is then switched on when the switching signal $U_S$ is at a low level corresponding to the reference potential and switched off when the switching signal $U_S$ is at a high level corresponding, for example, to the supply voltage $U_B$.

When the switching signal $U_S$ is at a high level, the fifth control transistor $T_5$ is conductive and thus supplies the entire current $I_{R3}$ available from the third quiescent current source $Q_{R3}$ to the ground terminal M. The fourth control transistor $T_4$ and the control current source $Q_S$ are therefore non-conducting and thus make no contribution to the base current $I_B$. The base current $I_B$ is not equal to zero, however, because the control transistors $T_1$, $T_2$ and $T_3$ and the open-collector transistor $T_o$ act as a reflection current arrangement with which the current $I_{R1}$ of the first quiescent current source $Q_{R1}$ is reflected as collector current $I_K$ of the open-collector transistor $T_o$, to the open-collector output A. The reflection coefficient (the ratio of the collector current $I_K$ of the open-collector transistor $T_o$ to the current $I_{R1}$ of the first quiescent current source $Q_{R1}$) is held at a value of 20, for example, by the ratio of the emitter surface area of the open-collector transistor $T_o$, to the emitter surface area of the first control transistor $T_1$. If the current $I_{R1}$ of the first quiescent current source $Q_{R1}$ is 75 $\mu$A, for example, the collector current $I_K$ is then 1.5 mA. This is the minimum collector current $I_K$ flowing through the open-collector transistor $T_o$, i.e. in the switched-off state the open-collector transistor $T_o$ is not entirely non-conductive but is simply in a higher ohmic state than in the switched-on state.

When the switching signal $U_S$ is at a low level, the fifth control transistor $T_5$ is non-conductive so that the current $I_{R3}$ of the third quiescent current source $Q_{R3}$ is fed to the base of the fourth control transistor $T_4$. This is therefore conductive and allows the current $I_{R2}$ of the second quiescent current source $Q_{R2}$ to flow with a magnitude of 3 mA, for example, to the base of the open-collector transistor $T_o$ which is thus switched on, i.e., switched into a low ohmic state. If at the same time the limiting signal $I_G$ is fed to the control input $Q_2$, part of the current $I_{R3}$ of the third quiescent current source $Q_{R3}$ is taken through the sixth control transistor $T_6$ to the ground terminal M so that only part of the current $I_{R2}$ that can be delivered from the second quiescent current source $Q_{R2}$ can be fed through the fourth control transistor $T_4$ to the base of the open-collector transistor $T_o$, i.e., the base current $I_B$ and therefore also the collector current $I_K$ are reduced by the limiting signal $I_G$.

The resistance values of the collector resistor $R_o$ and the comparator resistors $R_1$, $R_2$ are selected such that the current $I_{K1}$ of the constant current source $Q_{K1}$ and the reflection current $I_S$ of the reflection current arrangement S are equal when the collector current $I_K$ of the open-collector transistor $T_o$ is equal to a threshold current value of, for example, 80 mA. If the resistance value of the collector resistor $R_o$ is, for example, 3 Ω, the comparator resistance $R_1$ is, for example, 2 kΩ and the other comparator resistance $R_2$ is 11.6 kΩ. The two constant current sources $Q_{K1}$, $Q_{K2}$ deliver only low currents $I_{K1}$, $I_{K2}$ which are identical and have a value of, for example, 25 µA so that the circuit arrangement is loaded only slightly by the comparator stage K. If the current value of the collector current $I_K$ exceeds the threshold current value, the voltage drop between the open-collector output A and the emitter of the one comparator transistor $T_{K1}$ is greater than the voltage drop between the open-collector output A and the emitter of the other comparator transistor $T_{K2}$. Consequently, the reflection current $I_S$ is also greater than the collector current $I_{K1}$ of the first constant current source $Q_{K1}$. The proportion of the reflection current $I_S$ that exceeds the current $I_{K2}$ of the second constant current source $Q_{K2}$ is then fed as a limiting signal $I_G$ to the control input $Q_2$ of the base current source $Q_B$. By reducing the base current $I_B$, the collector current $I_K$ is then limited to a current value that is below the threshold current value. The capacitor C prevents the circuit arrangement from being forced to oscillate.

The open-collector transistor $T_o$ is operated in the reverse direction, i.e., inversely, when the output voltage $U_A$ has a negative value. If the output voltage $U_A$ has a voltage value that is below a negative threshold voltage, which is less than the reference potential by a diode forward voltage (0.7 V), it is switched into an inversely conductive state. The collector current $I_K$ then flows from the collector of the open-collector transistor $T_o$ through the collector resistor $R_o$ to the open-collector output A so that the open-collector transistor $T_o$ and the control transistors $T_1$, $T_2$, $T_3$ no longer act as a reflection or mirror current arrangement. Since the parasitic diode D is to be non-conductive, the voltage drop $U_R$ across the collector resistor $R_0$ must be of such a magnitude that a potential settles in at the collector of the open-collector transistor $T_o$ that is below the reference potential at the ground terminal M and consequently also the potential at the separation zone by an amount that is less than a diode forward voltage. The collector current $I_K$ must be designed to be correspondingly high because the voltage $U_R$ depends on it. The parasitic diode D is then switched in the reverse direction for all voltage values of the output voltage $U_A$ that are within a permissible range of values, for example between −1 V and +29 V. The smallest value of the permissible value range is defined by the collector current $I_K$ and the collector resistor $R_o$. The collector resistor $R_o$ must not, however, be overdimensioned because the output voltage $U_A$ in the case of open-collector transistor $T_o$ conducting in the forward direction should not exceed a maximum value of, for example, 0.5 V. Therefore, the collector current $I_K$ must be designed to be of sufficient magnitude by selecting a sufficiently large base current $I_B$ The current gain of the open-collector transistor $T_o$ is considerably smaller when operating in the reverse direction than when operating in the forward direction. Consequently, to generate a collector current $I_K$ of −200 mA, for example, a base current $I_B$ of approximately 20 mA is required. With an output voltage $U_A$, of −1 V and a collector resistance $R_o$ of 3 Ω, one then obtains at the collector of the open-collector transistor $T_o$ a potential of −0.4 V, i.e. the parasitic diode D remains in the non-conductive state. The base-collector diode of the open-collector transistor $T_o$ is, however, conductive so that the first control transistor $T_1$, at the base of which there is consequently a potential of approximately 0.3 V, is in the non-conductive state. For this reason, the entire current $I_{R1}$ of the first quiescent current source $Q_{R1}$ is fed to the Darlington stage formed by the second and third control transistors $T_2$, $T_3$ and amplified by these by a multiple factor. This current, amplified by a multiple factor to about 20 mA and supplied from the supply voltage $U_B$, is limited by the resistor $R_B$ and then fed as base current $I_B$ to the base of the open-collector transistor $T_o$.

What is claimed is:

1. An integrated circuit arrangement with an open-collector transistor ($T_o$) of the npn-transistor type, the collector of which is connected to an open-collector output (A) of the circuit arrangement and the emitter of which is connected to a ground terminal (M) of the circuit arrangement, and with an output voltage ($U_A$) being provided at the open-collector output (A), and wherein:

the collector of the open-collector transistor ($T_o$) is connected through a collector resistor ($R_o$) to the open-collector output (A) of the circuit arrangement and to the ground terminal (M) of the circuit arrangement through a parasitic diode (D), which is switched in the reverse direction when the voltage values of the output voltage ($U_A$) are positive;

a base current source ($Q_B$), connected to the base of the open-collector transistor ($T_o$), is provided to generate a base current ($I_B$) driving the open-collector transistor ($T_o$), where the open-collector transistor ($T_o$) is switched into an inversely conductive state by the base current (($I_B$) when the voltage values of the output voltage ($U_A$) are below a negative threshold value, in which state there is a voltage drop ($U_R$) across the collector resistor ($R_o$) of such a magnitude that the parasitic diode (D) remains switched in the reverse direction; and the base current source ($Q_B$) has a first quiescent current source ($Q_{R1}$) and a first control transistor ($T_1$), the collector and the base of the first control transistor ($T_1$) being connected together, the collector of the first control transistor ($T_1$) being connected to the first quiescent current source ($Q_{R1}$), the emitter of the first control transistor ($T_1$) being connected to the ground terminal (M) of the circuit arrangement, and the base of the first control transistor ($T_1$) being connected to the base of the open-collector transistor ($T_o$).

2. Circuit arrangement in accordance with claim 1 wherein the collector resistor ($R_o$) has a low ohmic resistance.

3. Circuit arrangement in accordance with claim 1, wherein the collector and the base of the first control transistor ($T_1$) are connected together through a second control transistor ($T_2$), the base of the second control transistor ($T_2$) being connected to the collector of the first control transistor ($T_1$), the emitter of the second control transistor ($T_2$) being connected to the base of the first control transistor ($T_1$), and the collector of the second control transistor ($T_2$) being connected to a supply terminal (V) of the circuit arrangement and to which a supply voltage ($U_B$) is applied.

4. Circuit arrangement in accordance with claim 3, wherein the collector of the first control transistor ($T_1$) and the base of the second control transistor ($T_2$) are connected together through a third control transistor ($T_3$), the base of the third control transistor ($T_3$) being connected to the collector of the first control transistor ($T_1$) and the collector of the second control transistor ($T_2$) being connected to the base of the second control transistor ($T_2$) through the collector-emitter path of the third control transistor ($T_3$).

5. An integrated circuit arrangement with an open-collector transistor ($T_o$) of the npn-transistor type, the collector of which is connected to an open-collector output (A) of the circuit arrangement and the emitter of which is connected to a ground terminal (M) of the circuit arrangement, and with an output voltage ($U_A$) being provided the open-collector output (A), and wherein:

the collector of the open-collector transistor ($T_o$) is connected through a collector resistor ($R_o$) to the open-collector output (A) of the circuit arrangement and to the ground terminal (M) of the circuit arrangement through a parasitic diode (D), which is switched in the reverse direction when the voltage values of the output voltage ($U_A$) are positive;

a base current source ($Q_B$), connected to the base of the open-collector transistor ($T_o$), is provided to generate a base current ($I_B$) driving the open-collector transistor ($T_o$), where the open-collector transistor ($T_o$) is switched into an inversely conductive state by the base current (($I_B$) when the voltage values of the output voltage ($U_A$) are below a negative threshold value, in which state there is a voltage drop ($U_R$) across the collector resistor ($R_0$) of such a magnitude that the parasitic diode (D) remains switched in the reverse direction;

the base current source ($Q_B$) has a control current source ($Q_S$) connected to the base of the open-collector transistor ($T_o$) and which can be switched by a switching signal ($U_S$) applied to the control current source ($Q_S$) through a circuit terminal ($Q_1$);

the base current source ($Q_B$) has a control input ($Q_2$) for a limiting signal ($I_G$) in order to reduce the base current; and a comparator stage (K) is provided to generate the limiting signal ($I_G$), where the base current ($I_B$) can be reduced by the limiting signal ($I_G$) in order to limit a collector current ($I_K$) applied at the collector of the open-collector transistor ($T_o$) when the current values of the collector current ($I_K$) exceed a threshold current value.

6. Circuit arrangement in accordance with claim 5, wherein the comparator stage (K) has two comparator inputs ($K_1$, $K_2$) each connected to respectively one of the collector resistor ($R_o$) terminals and a comparator output ($K_3$), to which the limiting signal ($I_G$) is applied, connected to the control input ($Q_2$) of the base current source ($Q_B$).

7. Circuit arrangement in accordance with claim 6, wherein the comparator stage (K) has two comparator resistors ($R_1$, $R_2$), two constant current sources ($Q_{K1}$, $Q_{K2}$) and two comparator transistors ($T_{K1}$, $T_{K2}$) connected as reflection current arrangement (S) with the collector of the one comparator transistor ($T_{K1}$) as reference current input ($S_R$) of the reflection current arrangement (S) and the collector of the other comparator transistor ($T_{K2}$) as reflection current output ($S_A$) of the reflection current arrangement (S), the emitters of the comparator transistors ($T_{K1}$, $T_{K2}$) being connected to one of the comparator inputs ($K_1$, $K_2$) respectively through one of the comparator resistors ($R_1$, $R_2$), the collectors of the comparator transistors ($T_{K1}$, $T_{K2}$) being connected to one of the constant current sources ($Q_{K1}$, $Q_{K2}$) respectively, and the reflection current output ($S_A$) of the reflection current arrangement (S) being connected to the comparator output ($K_3$).

8. An integrated circuit arrangement with an open-collector transistor ($T_o$) of the npn-transistor type, the collector of which is connected to an open-collector output (A) of the circuit arrangement and the emitter of which is connected to a ground terminal (M) of the circuit arrangement, and with an output voltage ($U_A$) being provided the open-collector output (A), and wherein:

the collector of the open-collector transistor ($T_o$) is connected through a collector resistor ($R_o$) to the open-collector output (A) of the circuit arrangement and to the ground terminal (M) of the circuit arrangement through a parasitic diode (D), which is switched in the reverse direction when the voltage values of the output voltage ($U_A$) are positive;

a base current source ($Q_B$), connected to the base of the open-collector transistor ($T_o$), is provided to generate a base current ($I_B$) driving the open-collector transistor ($T_o$), where the open-collector transistor ($T_o$) is switched into an inversely conductive state by the base current (($I_B$) when the voltage values of the output voltage ($U_A$) are below a negative threshold value, in which state there is a voltage drop ($U_R$) across the collector resistor ($R_0$) of such a magnitude that the parasitic diode (D) remains switched in the reverse direction; and the base current source ($Q_B$) has a control input ($Q_2$) for a limiting signal ($I_G$) in order to reduce the base current; and the control current source ($Q_S$) has a second quiescent current source ($Q_{R2}$), a third quiescent current source ($Q_{R3}$), a fourth control transistor ($T_4$), a fifth control transistor ($T_5$), and a sixth control transistor ($T_6$), the second quiescent current source ($Q_{R2}$) being connected through the collector-emitter path of the fourth control transistor ($T_4$) and to the base of the open-collector transistor ($T_o$), the third quiescent current source ($Q_{R3}$) being connected to the base of the fourth control transistor ($T_4$) to the collectors of the fifth and sixth control transistors ($T_5$,$T_6$), the base of the fifth control transistor ($T_5$) being connected to the circuit input ($Q_1$) of the control current source ($Q_S$), the base of the sixth control transistor ($T_6$) being connected to the control input ($Q_2$) of the base current source ($Q_B$). and the emitters of the fifth and sixth control transistors ($T_5$, $T_6$) being connected to the ground terminal (M) of the circuit arrangement.

* * * * *

UNITED STATES PATENT AND TRADEMARK OFFICE
CERTIFICATE OF CORRECTION

PATENT NO : 5,973,513
DATED : October 26, 1999
INVENTOR(S) : Anton Koch

It is certified that error appears in the above-identified patent and that said Letters Patent are hereby corrected as shown below:

On the title page, change line [73] to read --Temic Telefunken microelectronic GmbH, Heilbronn, GERMANY--

Signed and Sealed this

Twenty-second Day of May, 2001

Attest:

NICHOLAS P. GODICI

Attesting Officer     Acting Director of the United States Patent and Trademark Office